(12) United States Patent
Argoitia et al.

(10) Patent No.: US 11,891,524 B2
(45) Date of Patent: Feb. 6, 2024

(54) PIGMENTS HAVING A VAPOR DEPOSITED COLORANT

(71) Applicant: VIAVI SOLUTIONS INC., Milpitas, CA (US)

(72) Inventors: Alberto Argoitia, Santa Rosa, CA (US); Larry Meredith, Santa Rosa, CA (US); Carole Thoraval, Santa Rosa, CA (US); Vladimir Raksha, Santa Rosa, CA (US)

(73) Assignee: VIAVI SOLUTIONS INC., Chandler, AZ (US)

( * ) Notice: Subject to any disclaimer, the term of this patent is extended or adjusted under 35 U.S.C. 154(b) by 249 days.

(21) Appl. No.: 15/849,570

(22) Filed: Dec. 20, 2017

(65) Prior Publication Data

US 2018/0171151 A1   Jun. 21, 2018

Related U.S. Application Data

(60) Provisional application No. 62/437,362, filed on Dec. 21, 2016.

(51) Int. Cl.
  *C09C 1/62* (2006.01)
  *C09C 1/66* (2006.01)
  (Continued)

(52) U.S. Cl.
  CPC .......... *C09C 1/627* (2013.01); *C09B 67/0008* (2013.01); *C09B 67/0098* (2013.01);
  (Continued)

(58) Field of Classification Search
  CPC ....... C09C 1/00; C09C 1/0021; C09C 1/0051; C09C 1/627; C09C 1/64; C09C 1/66; C09C 3/10; C09C 2200/1058; C09C 2220/20; C09B 67/0008; C09B 67/0098; C23C 16/442; C23C 16/4481; C01P 2004/20; C01P 2004/86; C09D 3/10
  See application file for complete search history.

(56) References Cited

U.S. PATENT DOCUMENTS 3,078,177 A * 2/1963 Hann ........................ B05D 1/24
                                                                 427/185
4,268,541 A   5/1981 Ikeda et al.
(Continued)

FOREIGN PATENT DOCUMENTS

CN         1073462 A    6/1993
CN         1265405 A    9/2000
(Continued)

OTHER PUBLICATIONS

Material Safety Data Sheet for Polyaniline. ThermoFisher Scientific (Feb. 21, 2020) (Year: 2020).*
(Continued)

*Primary Examiner* — James A Fiorito
*Assistant Examiner* — Ross J Christie
(74) *Attorney, Agent, or Firm* — Mannava & Kang, P.C.

(57) ABSTRACT

A particle including a core particle; and a vapor deposited colorant including an organic colored material that encapsulates the core particle. The particle can be a special effect pigment or a thin film interference pigment. Methods of making the particle are also disclosed.

20 Claims, 8 Drawing Sheets

(51) Int. Cl.
| | |
|---|---|
| C09C 1/64 | (2006.01) |
| C09C 1/00 | (2006.01) |
| C09B 67/08 | (2006.01) |
| C23C 16/442 | (2006.01) |
| C23C 16/448 | (2006.01) |
| C09B 67/00 | (2006.01) |
| C09D 11/037 | (2014.01) |
| C09C 3/10 | (2006.01) |

(52) U.S. Cl.
CPC ............. *C09C 1/00* (2013.01); *C09C 1/0021* (2013.01); *C09C 1/0051* (2013.01); *C09C 1/64* (2013.01); *C09C 1/66* (2013.01); *C09C 3/10* (2013.01); *C09D 11/037* (2013.01); *C23C 16/442* (2013.01); *C23C 16/4481* (2013.01); *C01P 2004/20* (2013.01); *C01P 2004/86* (2013.01); *C09C 2200/1058* (2013.01); *C09C 2220/20* (2013.01)

(56) References Cited

U.S. PATENT DOCUMENTS

| | | | |
|---|---|---|---|
| 4,271,256 A | 6/1981 | Kido et al. | |
| 4,344,987 A * | 8/1982 | Ostertag | C09C 1/0015 106/417 |
| 4,585,673 A * | 4/1986 | Sigai | H01J 61/44 252/301 |
| 4,587,198 A | 5/1986 | Fisch | |
| 4,650,494 A | 3/1987 | Kutsukake et al. | |
| 4,838,648 A | 6/1989 | Phillips et al. | |
| 4,866,027 A | 9/1989 | Henzel | |
| 4,879,140 A | 11/1989 | Gray et al. | |
| 4,935,166 A | 6/1990 | Lee et al. | |
| 5,026,429 A | 6/1991 | Mronga et al. | |
| 5,102,213 A | 4/1992 | Lee et al. | |
| 5,213,618 A | 5/1993 | Souma et al. | |
| 5,270,854 A | 12/1993 | Lee et al. | |
| 5,409,758 A | 4/1995 | Hiyoshi et al. | |
| 5,540,770 A | 7/1996 | Schmid et al. | |
| 5,626,661 A * | 5/1997 | Schmid | C09C 1/0015 106/31.9 |
| 5,759,255 A * | 6/1998 | Venturini | C09C 3/12 106/490 |
| 5,874,188 A | 2/1999 | Roberts et al. | |
| 5,931,996 A | 8/1999 | Reisser et al. | |
| 6,447,553 B1 | 9/2002 | Mikhael et al. | |
| 6,533,857 B1 * | 3/2003 | Schmid | A61Q 1/02 106/403 |
| 6,565,770 B1 * | 5/2003 | Mayer | B82Y 10/00 106/403 |
| 6,569,529 B1 | 5/2003 | Phillips et al. | |
| 6,613,383 B1 | 9/2003 | George et al. | |
| 6,686,042 B1 | 2/2004 | Legallee | |
| 7,169,327 B2 * | 1/2007 | Ito | C08K 9/02 252/500 |
| 7,455,904 B2 | 11/2008 | O'Keefe | |
| 7,459,182 B2 | 12/2008 | Xiong et al. | |
| 7,901,609 B2 | 3/2011 | Xiong et al. | |
| 7,951,418 B2 | 5/2011 | O'Keefe | |
| 8,980,976 B2 | 3/2015 | Henglein et al. | |
| 2001/0047739 A1 | 12/2001 | Archambeault | |
| 2002/0160194 A1 | 10/2002 | Phillips et al. | |
| 2007/0134179 A1 * | 6/2007 | Ino | C09D 7/68 106/446 |
| 2008/0191153 A1 * | 8/2008 | Marganski | B01J 7/00 250/492.21 |
| 2008/0249209 A1 | 10/2008 | Trummer et al. | |
| 2009/0069447 A1 * | 3/2009 | Kitamura | C23C 18/1635 524/443 |
| 2011/0237683 A1 * | 9/2011 | Schmid | C09C 1/0024 514/770 |
| 2012/0157583 A1 * | 6/2012 | Shiao | C04B 28/24 524/64 |
| 2013/0119298 A1 | 5/2013 | Raksha et al. | |
| 2016/0168388 A1 | 6/2016 | Barbe et al. | |

FOREIGN PATENT DOCUMENTS

| | | | | |
|---|---|---|---|---|
| CN | 1280598 A | 1/2001 | | |
| CN | 1384858 A | 12/2002 | | |
| CN | 1468289 | 1/2004 | | |
| CN | 1610729 | 4/2005 | | |
| CN | 1688659 A | 10/2005 | | |
| CN | 1735562 | 2/2006 | | |
| CN | 1756805 A | 4/2006 | | |
| CN | 1784476 A | 6/2006 | | |
| CN | 1910243 | 2/2007 | | |
| CN | 101238183 A | 8/2008 | | |
| CN | 101384674 | 3/2009 | | |
| CN | 101695466 A | 4/2010 | | |
| CN | 102037084 A | 4/2011 | | |
| CN | 102337059 A | 2/2012 | | |
| CN | 104449334 | 3/2015 | | |
| CN | 104781347 | 7/2015 | | |
| EP | 0536913 | 4/1993 | | |
| EP | 1852475 | 11/2007 | | |
| EP | 2410022 | 1/2012 | | |
| EP | 2799398 | 11/2014 | | |
| EP | 2799398 A2 * | 11/2014 | ................ | C01F 7/02 |
| JP | H0959532 | 3/1997 | | |
| TW | 300249 B | 3/1997 | | |
| TW | I239986 B | 9/2005 | | |
| WO | 02/10290 | 2/2002 | | |
| WO | WO-0224818 A1 * | 3/2002 | ................ | B32B 7/02 |
| WO | 2016047231 A1 | 3/2016 | | |

OTHER PUBLICATIONS

Material Safety Data Sheet for Polypyrrole. Polysciences Inc. (Nov. 15, 2013) (Year: 2013).*

Benjamin Tawiah et al., "Phthalocyanine green aluminum pigment prepared by inorganic acid radical/radical polymerization for waterborne textile applications", International Journal of Industrial Chemistry, Biomed Central Ltd, London, UK, vol. 8, No. 1, Jun. 15, 2016, pp. 17-28.

A. Bulanovs et al., "Luminescence and structural properties of thermally evaporated benzanthrone dyes thin films", Opto-Electronics Review 21, No. 2, 2013, 6 pages.

K P. Gritsenko et al., "Optical properties of dye films deposited in vacuum with laser and plasma action", Proc. SPIE, 3738, pp. 461-464, 1999.

K. Grytsenko et al., "Growth and optical properties of dye films and dye-in-polymer matrix deposited by vacuum evaporation", Semiconductor Physics, Quantum Electronics & Optoelectronics, 2010, vol. 13, No. 2, pp. 177-179.

K. P. Gritsenko et al., "Dye-filled polymer film formation in vacuum", Proc. SPIE 4833, Applications of Photonic Technology 5, 487 (Feb. 1, 2003), 6 pages.

Konstantin P. Gritsenko et al., "Thin-Film Deposition of Polymers by Vacuum Degradation", Chem. Rev. 2003, 103, pp. 3607-3649.

M. M. El-Nahass et al., " Optical Properties of Copper Phthalocyanine (CuPc) Thin Films", Egypt. J. Sol., vol. 24, No. 1, 2001, 9 pages.

M.S. Aziz et al., "Optical properties of Azo Dye (1-Phenylazo-2-Naphthol) thin films", Eur. Phys. J. Appl. Phys. 48, 20401 (Year 2009), 6 pages.

Pasi Jalkanen et al., "Fabrication and characterization of vacuum deposited fluorescein thin films", Jun. 20, 2011, 24 pageshttps://arxiv.org/abs/1106.3849v1.

Peter Wibling, "Metallic Effect Pigments", European Coatings Literature, Hannover: Vincentz Network, 2006, 4 pages.

Pia Sundberg et al., "Organic and inorganic-organic thin film structures by molecular layer deposition: A review", Beilstein Journal of Nanotechnology, 2014, 5, pp. 1104-1136.

Thomas Mayer et al., "Bulk Sensitization of Inorganic Semiconductors with Organic Guest Molecules: Zink Phthalocyanines Embed-

(56) References Cited

OTHER PUBLICATIONS ded in μc-Si and ZnSe Host Matrices", Proceedings of the Photovoltaic Energy Conversion Conference, vol. 1, pp. 190-193, May 7-12, 2006.
"New Materials Dictionary", edited by Zhou Huijiu, p. 269, Shanghai Science and Technology Literature Publishing House, Dec. 31, 1996, 3 pages. (Concise statement of relevance provided by the English translation of China Office Action, CN Application No. 201711391868.9, dated Oct. 20, 2022, 12 pages, which cites the Zhou Huijiu reference as Exhibit 2).
"Synthetic Resins and Plastics Handbook", edited by Xu Changqing, pp. 687, Chemical Industry Press, Nov. 30, 1991, 3 pages. (Concise statement of relevance provided by the English translation of China Office Action, CN Application No. 201711391868.9, dated Oct. 20, 2022, 12 pages).
English translation of China Office Action, CN Application No. 201711391868.9, dated Oct. 20, 2022, 12 pages.
Chemical And Health Consumption [M], Dong yan, Dongying: China university of petroleum press, pp. 145-146, Aug. 2008.
Ding Xuejie et al., Production Technology and Application of Plastic Additives, Guangdong Science and Technology Press, Dec. 1996, 1st edition, pp. 559. (Concise statement of relevance provided by English translation of the Notification of Reexamination for Chinese Application No. 2017113901194, dated Nov. 18, 2022, 10 pages.).
English translation of the Notification of Reexamination for Chinese Application No. 2017113901194, dated Nov. 18, 2022, 10 pages.
English translation of the Notification of Reexamination for Chinese Application No. 2017113901194, dated Sep. 14, 2020, 7 pages. (Explaining the relevancy of reference Chemical and Health Consumption).
Li Fengsheng et al., Post-treatment Technology and Application of Micro-nano Powders, National Defense Industry Press, Sep. 2005, 1st edition, pp. 417-418. (Machine translation provided; cited as Exhibit 3 in English translation of the Notification of Reexamination for Chinese Application No. 2017113901194, dated Nov. 18, 2022, 10 pages, submitted herewith).
Mo Shucheng et al., Organic Pigments, Chemical Industry Press, Dec. 1988, 1st edition, pp. 41-48. (Concise statement of relevance provided by English translation of the Notification of Reexamination for Chinese Application No. 2017113901194, dated Nov. 18, 2022, 10 pages.).
Song Jian et al., Microencapsulation Technology and Application, Chemical Industry Press, Sep. 2001, 1st edition, pp. 255. (Machine translation provided; cited as Exhibit 4 in English translation of the Notification of Reexamination for Chinese Application No. 2017113901194, dated Nov. 18, 2022, 10 pages, submitted herewith).
Wang Yuehua et al., Design, Preparation and Application of Thin Films, China University of Mining and Technology Press, 1st edition, Sep. 2016, pp. 47-49. (Concise statement of relevance provided by English translation of the Notification of Reexamination for Chinese Application No. 2017113901194, dated Nov. 18, 2022, 10 pages.).
Wang Yuehua et al., Design, Preparation and Application of Thin Films, China University of Mining and Technology Press, 1st edition, Sep. 2016, pp. 42-52. (Concise statement of relevance provided by English translation of the Notification of Reexamination for Chinese Application No. 2017113901194, dated Nov. 18, 2022, 10 pages, cited as Exhibit 2.).

\* cited by examiner

PIGMENTS HAVING A VAPOR DEPOSITED COLORANT

RELATED APPLICATIONS

The present application claims priority to U.S. Provisional Application No. 62/437,362, filed Dec. 21, 2016, the disclosure of which is hereby incorporated by reference.

FIELD OF THE INVENTION

The present disclosure generally relates to a particle, such as a pigment, having a core particle; and a vapor deposited colorant comprising an organic colored material that encapsulates the core particle. The particle can be a special effect pigment or a thin film interference pigment. Methods of making the particle are also disclosed.

BACKGROUND OF THE INVENTION

Colored metallic pigments in their simplest form are manufactured from colored metals. Flakes in these pigments have been coated with colored transparent or semi-transparent low refractive index material or high refractive index material. The color effect can come from a combination of reflection, absorption and interference of incident light. Interference colors in interference pigments have been created by formation on the surface of an aluminum flake of a Fabry-Perot structure consisting of a transparent dielectric and semi-transparent metallic absorber.

Methods of fabrication of colored metallic pigments vary in their nature. In one method, aluminum flakes were coated by layers of metal oxides by one of numerous wet chemistry methods, such as a hydrolysis of organic metal ester compounds. Pigments have also been colored by sol-gel precipitation of silicon dioxide from tetraethyl silicate together with a dispersed colorant. Vacuum deposition technology has been used for fabrication of colored metallic pigment based on the Fabry-Perot structure. For example, colored pigments with saturated color were produced when a spacer layer was made from a material with high (n>2) index of refraction. Color-shifting interference pigments were fabricated when the dielectric layer had a low index of refraction (n<1.6).

SUMMARY OF THE INVENTION

In an aspect, there is disclosed a particle comprising a core particle; and a vapor deposited colorant comprising an organic colored material that at least partially encapsulates the core particle.

In another aspect, there is disclosed a method of making a particle comprising introducing a carrier gas into an organic colored material container; heating the organic colored material container to produce an organic colored vapor; and introducing the organic colored vapor into a fluidized bed reactor comprising a core particle.

Additional features and advantages of various embodiments will be set forth, in part, in the description that follows, and will, in part, be apparent from the description, or may be learned by the practice of various embodiments. The objectives and other advantages of various embodiments will be realized and attained by means of the elements and combinations particularly pointed out in the description herein.

BRIEF DESCRIPTION OF THE DRAWINGS

The present disclosure in its several aspects and embodiments can be more fully understood from the detailed description and the accompanying drawings, wherein.

Throughout this specification and figures like reference numbers identify like elements.

DETAILED DESCRIPTION OF THE INVENTION

It is to be understood that both the foregoing general description and the following detailed description are exemplary and explanatory only, and are intended to provide an explanation of various embodiments of the present teachings. The layers/components shown in each Figure may be described with regard to a particular Figure, but it is understood that the description of a particular layer/component would be applicable to the equivalent layer/component in the other Figures.

In its broad and varied embodiments, disclosed herein is a particle, such as a special effect pigment or a thin film interference pigment, having saturated colors. A core particle can be at least partially encapsulated with a vapor deposited colorant comprising at least one of an organic colored material, an organic uncolored material, an inorganic material or a combination thereof, including at least one layer of colorant. The vapor deposited colorant can be used for changing the optical properties of the particles, protecting the resultant particle against oxidation, decreasing the resultant particle reactivity with a surrounding media, and/or functionalizing the particle surface. Encapsulation, such as at least partial, encapsulation, of the core particle can be done in a dry environment, i.e., not a wet environment, and therefore does not require any filtration, drying, etc. processes that would be used in encapsulation in a wet environment. The at least partial encapsulation of the core particles can occur at almost atmospheric pressure and therefore can avoid the use of equipment necessary for operating under a vacuum. The particles can be used with light detection and radar (LIDAR) technology applications.

The particles, such as pigments, can be obtained by simple addition of selectively absorbing layers on core particles, such as platelets, and/or by a combination of absorption and thin film interference. In some aspects, the particles, such as pigments, can include an encapsulating absorber layer to produce a special effect pigment.

Figure 1:
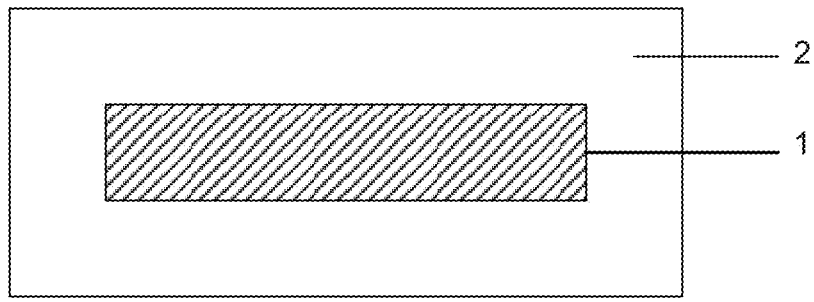
FIG. 1 is a particle according to an aspect of the invention.

FIG. 1 illustrates a particle comprising a core particle 1; and a vapor deposited colorant 2 that encapsulates the core particle 1. The colorant can at least partially, such as totally, encapsulate the core particle. The core particle 1 can be in a form of a platelet or a flake.

The core particle 1 can include any material that can render the core particle 1 opaque, such as a reflector material. In an aspect, the material can be a metal and/or metal alloy. In one example, the material for the core particle 1 can include any materials that have reflective characteristics. An example of a reflector material can be aluminum, which has good reflectance characteristics, is inexpensive, and easy to form into or deposit as a thin layer. However, other reflector materials can also be used in place of aluminum. For example, aluminum, zinc, steel, copper, silver, gold, platinum, palladium, nickel, cobalt, niobium, chromium, tin, and combinations or alloys of these or other metals can be used as reflective materials, such as bronze, brass, and stainless steel. In an aspect, the material for the core particle 1 can be a white or light colored metal. Other useful reflector materials include, but are not limited to, the transition and lanthanide metals and combinations thereof.

The thickness of the core particle 1 can range from about 10 nm to about 2000 nm, although this range should not be taken as restrictive. In an aspect, the core particle 1 can include a thickness ranging from about 20 nm to about 1750 nm, for example from about 40 nm to about 1500 nm, from about 60 nm to about 1000 nm, from about 80 to about 900 nm, and as a further example from about 100 to about 800 nm. For example, the lower limit of 10 nm can be selected for a material, such as aluminum, so that the aluminum is of a minimum optical density of about 0.5 at a wavelength of about 550 nm. Other reflector materials can justify higher or lower minimum thicknesses in order to obtain a sufficient optical density or achieve the desired effect. The upper limit of about 2000 nm can also be higher or lower depending on the desired effect and the materials used.

The core particle 1 can be microstructured so as to provide a diffractive property of light. In an aspect, the core particle 1 can made of any material and in any thickness so long as the core particle 1 is opaque.

As illustrated in FIG. 1, the core particle 1 can be at least partially encapsulated by a vapor deposited colorant 2. The vapor deposited colorant 2 can encapsulate all sides (top, bottom, right, and left) of the core particle 1. Alternatively, the vapor deposited colorant 2 can cover one, two or three sides of the core particle 1. For example, the vapor deposited colorant 2 can cover two opposite sides. The vapor deposited colorant 2 can cover just the top and bottom sides of the core particle 1 or, for example, the vapor deposited colorant 2 can cover just the right and left sides of the core particle 1. In another aspect, the vapor deposited colorant 2 can partially cover all the sides of the core particle 1.

The vapor deposited colorant 2 can comprise any organic colored material, such as organic pigments and organic dyes. In an aspect, the vapor deposited colorant 2 can include an organic colored material. Non-limiting examples of an organic colored material include perylene, perinone, quinacridone, quinacridonequinone, anthrapyrimidine, anthraquinone, anthanthrone, benzimidazolone, disazo condensation, azo, quinolones, xanthene, azomethine, quinophthalone, indanthrone, phthalocyanine, triarylcarbonium, dioxazine, aminoanthraquinone, isoindoline, diketopyrrolopyrrole, thioindigo, thiazineindigo, isoindoline, isoindolinone, pyranthrone, isoviolanthrone, miyoshi methane, triarylmethane, or mixtures thereof.

Figure 2:
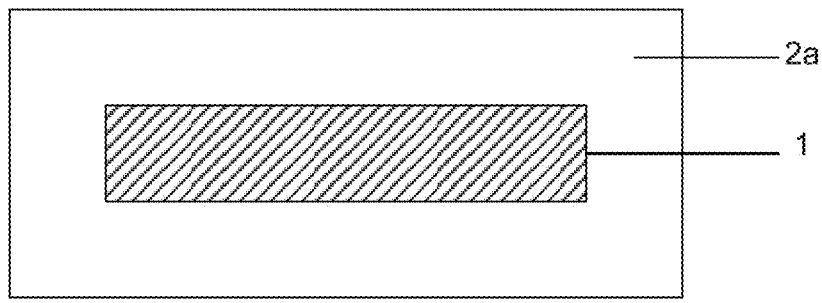
FIG. 2 is a particle according to another aspect of the invention.

Additional non-limiting examples of an organic colored material for use in the vapor deposited colorant 2 include, for example, C.I. Pigment Red 123 (C.I. No. 71 145), C.I. Pigment Red 149 (C.I. No. 71 137), C.I. Pigment Red 178 (C.I. No. 71 155), C.I. Pigment Red 179 (C.I. No. 71 130), C.I. Pigment Red190 (C.I. 71 140), C.I. Pigment Red 224 (C.I. No. 71 127), C.I. Pigment Violet 29 (C.I. No. 71 129), C.I. Pigment Orange 43 (C.I. No. 71 105), C.I. Pigment Red 194 (C.I. No. 71 100), C.I. Pigment Violet 19 (C.I. No. 73 900), C.I. Pigment Red 122 (C.I. No. 73 915), C.I. Pigment Red 192, C.I. Pigment Red 202 (C.I. No. 73 907), C.I. Pigment Red 207, C.I. Pigment Red 209 (C.I. No. 73 905), C.I. Pigment Red 206 (C.I. No. 73 900/73 920), C.I. Pigment Orange 48 (C.I. No. 73 900/73 920), C.I. Pigment Orange 49 (C.I. No. 73 900/73 920), C.I. Pigment Orange 42, C.I. Pigment Yellow 147, C.I. Pigment Red 168 (C.I. No. 59 300), C.I. Pigment Yellow 120 (C.I. No. 11 783), C.I. Pigment Yellow 151 (C.I. No. 13 980), C.I. Pigment Brown 25 (C.I. No. 12 510), C.I. Pigment Violet 32 (C.I. No. 12 517), C.I. Pigment Orange 64; C.I. Pigment Brown 23 (C.I. No. 20 060), C.I. Pigment Red 166 (C.I. No. 20 730), C.I. Pigment Red 170 (C.I. No. 12 475), C.I. Pigment Orange 38 (C.I. No. 12 367), C.I. Pigment Red 188 (C.I. No. 12 467), C.I. Pigment Red 187 (C.I. No. 12 486), C.I. Pigment Orange 34 (C.I. No. 21 115), C.I. Pigment Orange 13 (C.I. No. 21 110), C.I. Pigment Red 9 (C.I. No. 12 460), C.I. Pigment Red 2 (C.I. No. 12 310), C.I. Pigment Red 112 (C.I. No. 12 370), C.I. Pigment Red 7 (C.I. No. 12 420), C.I. Pigment Red 210 (C.I. No. 12 477), C.I. Pigment Red 12 (C.I. No. 12 385), C.I. Pigment Blue 60 (C.I. No. 69 800), C.I. Pigment Green 7 (C.I. No. 74 260), C.I. Pigment Green 36 (C.I. No. 74 265); C.I. Pigment Blue 15:1, 15:2, 15:3, 15:4, 15:6 and 15 (C.I. No. 74 160); C.I. Pigment Blue 56 (C.I. No. 42 800), C.I. Pigment Blue 61 (C.I. No. 42 765:1), C.I. Pigment Violet 23 (C.I. No. 51 319), C.I. Pigment Violet 37 (C.I. No. 51 345), C.I. Pigment Red 177 (C.I. No. 65 300), C.I. Pigment Red 254 (C.I. No. 56 110), C.I. Pigment Red 255 (C.I. No. 56 1050), C.I. Pigment Red 264, C.I. Pigment Red 270, C.I. Pigment Red 272 (C.I. No. 56 1150), C.I. Pigment Red 71, C.I. Pigment Orange 73, C.I. Pigment Red 88 (C.I. No. 73 312), C.I. Pigment Yellow 175 (C.I. No. 11 784), C.I. Pigment Yellow 154 (C.I. No. 11 781), C.I. Pigment Yellow 83 (C.I. No. 21 108), C.I. Pigment Yellow 180 (C.I. No. 21 290), C.I. Pigment Yellow 181 (C.I. No. 11 777), C.I. Pigment Yellow 74 (C.I. No. 11 741), C.I. Pigment Yellow 213, C.I. Pigment Orange 36 (C.I. No. 11 780), C.I. Pigment Orange 62 (C.I. No. 11 775), C.I. Pigment Orange 72, C.I. Pigment Red 48:2/3/4 (C.I. No. 15 865:2/3/4), C.I. Pigment Red 53:1 (C.I. No. 15 585:1), C.I. Pigment Red 208 (C.I. No. 12 514), C.I. Pigment Red 185 (C.I. No. 12 516), C.I. Pigment Red 247 (C.I. No. 15 915), Pigment Black 31 ($C_{40}H_{26}N_2O_4$), Pigment Orange 16 ($C_{32}H_{24}C_{12}N_8O_2$), FIG. 2 illustrates a particle, such as a special effect pigment, comprising a core particle 1; and a vapor deposited colorant 2 at least partially encapsulating the core particle 1, wherein the vapor deposited colorant 2 can be a composite layer 2a comprising an organic colored material, as described above with regard to FIG. 1, and an inorganic material. The core particle 1 can be a reflector material as described above with regard to FIG. 1. The inorganic material for use in the composite layer 2a can be made from any materials. Non-limiting examples of suitable materials include magnesium fluoride, silicon monoxide, silicon dioxide, aluminum oxide, aluminum fluoride, titanium dioxide, aluminum nitride, boron nitride, boron carbide, tungsten oxide, cerium fluoride, lanthanum fluoride, neodymium fluoride, samarium fluoride, barium fluoride, calcium fluoride, lithium fluoride, tungsten carbide, titanium carbide, titanium nitride, silicon nitride, zinc sulfide, glass flakes, diamond-like carbon, and combinations thereof. The inorganic material can be made from materials including a refractive index ranging from about 1.3 to about 2.3. In an aspect, the inorganic material can be a material including a low refractive index of less than about 1.65. In another aspect, the inorganic material can be a material including a high refractive index of greater than about 2.2.

Figure 3:
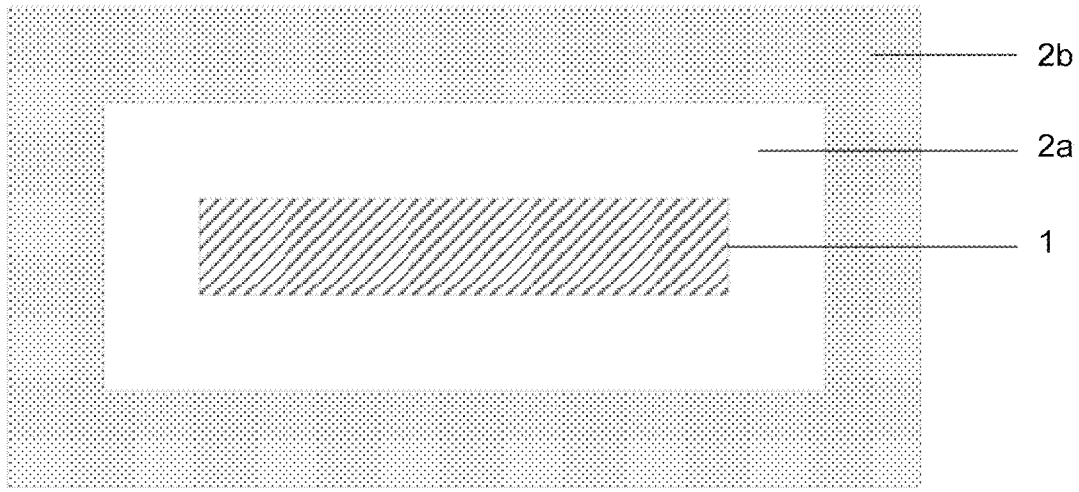
FIG. 3 is a particle according to another aspect of the invention.

FIG. 3 illustrates a particle, such as a special effect pigment, comprising a core particle 1, a first vapor deposited colorant 2a at least partially encapsulating the core particle 1; and a second vapor deposited colorant 2b at least partially encapsulating the first vapor deposited colorant 2a. The core particle 1 can be a reflector material as described above with regard to FIG. 1. The particle, such as a pigment, can be obtained by at least partial encapsulation of a core particle 1 in a form of a platelet with successive vapor deposited colorants 2, such as a first vapor deposited colorant 2a, a second vapor deposited colorant 2b, a third vapor deposited colorant 2c (not shown in FIG. 3), etc. Each vapor deposited colorant 2 can selectively absorb some of the wavelengths of light.

Each vapor deposited colorant 2 can be the same or different. In an aspect, a first vapor deposited colorant 2a can be the same composition as a second vapor deposited colorant 2b. For example, each vapor deposited colorant 2 can be the same organic colored material, such as those described above. In another aspect, a first vapor deposited colorant 2a can have the same thickness as a second vapor deposited colorant 2b.

Alternatively, each vapor deposited colorant 2 can be different. A first vapor deposited colorant 2a can be a different composition as a second vapor deposited colorant 2b. For example, the first vapor deposited colorant 2a can comprise an organic colored material whereas a second vapor deposited colorant 2b can be a composite comprising an organic colored material and an inorganic material, such as those described above. Additionally, the first vapor deposited colorant 2a can be a composite comprising an organic colored material and an inorganic material whereas a second vapor deposited colorant 2b can comprise an organic colored material.

Moreover, a first vapor deposited colorant 2a can comprise an organic colored material, such as Pigment Red 254 and a second vapor deposited colorant 2b can comprise an organic colored material, such as Violet 19. Similarly, a first vapor deposited colorant 2a can be a composite comprising an organic colored material and an inorganic material, such as a high refractive index material, and a second vapor deposited colorant 2b can be a composite comprising an organic colored material and an inorganic material, such as a low refractive index material. Each and every combination and permutation of compositions possible for the vapor deposited colorant 2 are envisioned as well as each and every combination and permutation of compositions possible for each vapor deposited colorant (2a, 2b, 2c, 2d, etc.).

In another aspect, a first vapor deposited colorant 2a can have a different thickness as a second vapor deposited colorant 2b. Each vapor deposited colorant 2 within a particle can vary, e.g., same composition, different thickness or different composition and same thickness.

Figure 4:
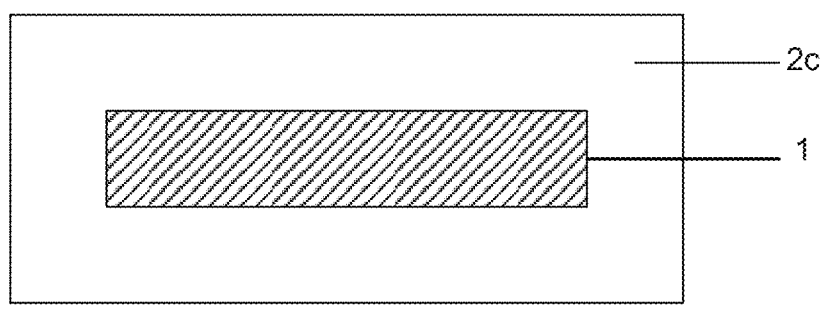
FIG. 4 is a particle according to another aspect of the invention.

FIG. 4 illustrates a particle, such as a special effect pigment, comprising a core particle 1; and a vapor deposited colorant 2 at least partially encapsulating the core particle 1, wherein the vapor deposited colorant 2 is a composite layer 2c comprising two or more organic colored materials. In another aspect, the composite layer 2c can comprise two or more organic colored materials and an inorganic material. Each organic colored material present in the composite layer 2c can selectively absorb a different wavelength of light. The core particle 1 can be a reflector material as described above with regard to FIG. 1.

The vapor deposited colorant 2 can include a thickness of about 40 nm to about 1000 nm, such as from about 40 nm to about 600 nm, for example from about 50 nm to about 500 nm.

Figure 5:
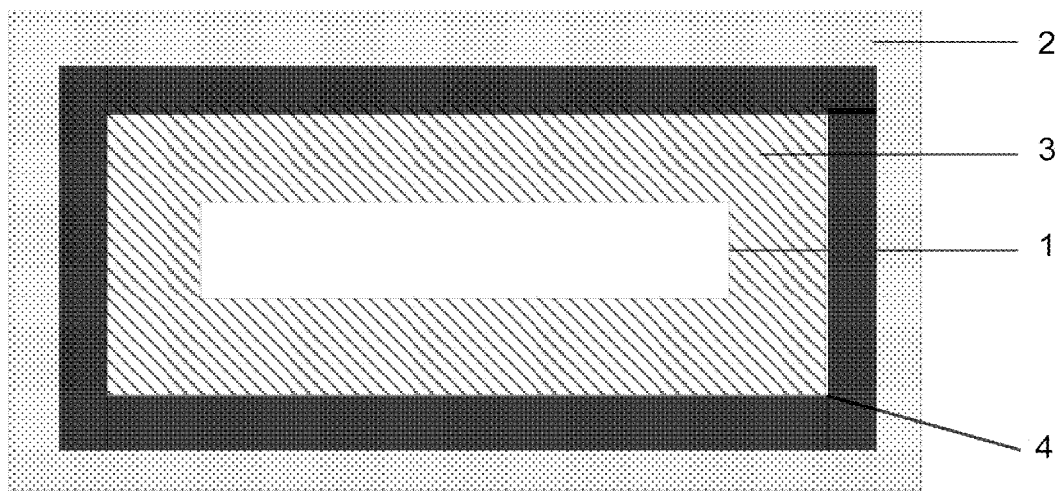
FIG. 5 is a particle according to another aspect of the invention.

FIG. 5 illustrates a particle, such as a thin film interference pigment, comprising a core particle 1; a dielectric layer 3 at least partially encapsulating the core particle 1; an absorber layer 4 at least partially encapsulating the dielectric layer 3; and a vapor deposited colorant 2 at least partially encapsulating the absorber layer. The core particle 1 can be a reflector material as described above with regard to FIG. 1.

The dielectric layer 3 can include materials, such as transparent materials. Non-limiting examples of suitable materials include magnesium fluoride, silicon monoxide, silicon dioxide, aluminum oxide, aluminum fluoride, titanium dioxide, aluminum nitride, boron nitride, boron carbide, tungsten oxide, cerium fluoride, lanthanum fluoride, neodymium fluoride, samarium fluoride, barium fluoride, calcium fluoride, lithium fluoride, tungsten carbide, titanium carbide, titanium nitride, silicon nitride, zinc sulfide, glass flakes, diamond-like carbon, and combinations thereof. The absorber layer 4 can be formed to substantially surround or encapsulate the dielectric layer 3. Suitable materials for the absorber layer 4 can include all metals having uniform absorption or selective absorption in the visible spectrum. Examples of such metals include chromium, nickel, iron, titanium, aluminum, tungsten, molybdenum, niobium, combinations or alloys thereof, such as Inconel (Ni—Cr—Fe), metals mixed in a dielectric matrix, or other substances that are capable of acting as a uniform or selective absorber in the visible spectrum. The absorber layer 4 can be formed to include have a thickness in a range of from about 2 nm to about 80 nm, such as from about 3 nm to about 30 nm. It should be appreciated, however, that still other thicknesses for the absorber layer 4 is contemplated for altering the optical performance of the pigment. It should be understood that the absorber layer 4 at thin thicknesses does not need to be continuous to still work as an optical absorber. For example, a plurality of islands or dots of absorber material can suffice as an absorber.

Figure 6:
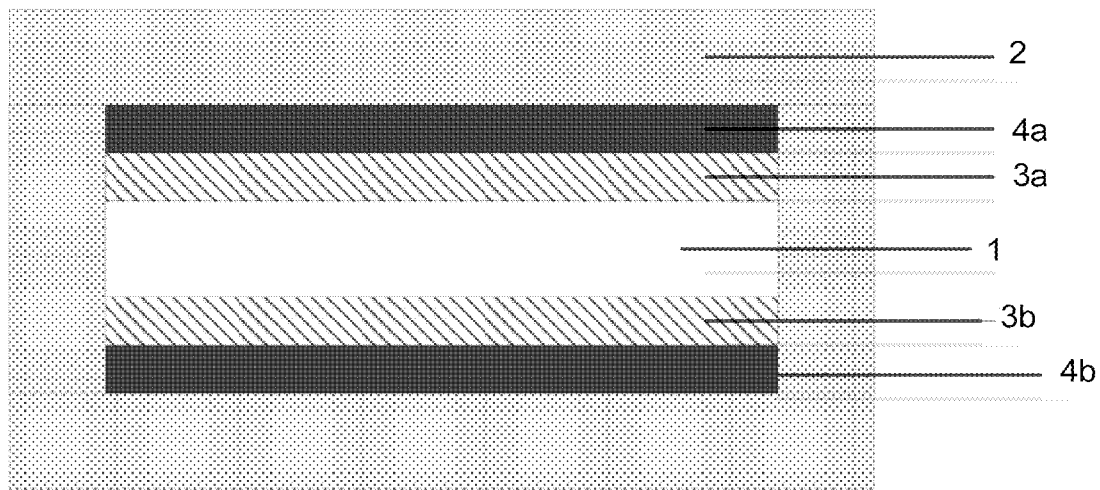
FIG. 6 is a particle according to another aspect of the invention.

FIG. 6 illustrates a particle, such as a special effect pigment, can comprise a core platelet comprising a core particle 1, a first dielectric layer 3a and a second dielectric layer 3b on opposites sides of the core particle 1, a first absorber layer 4a on the first dielectric layer 3a, and a second absorber layer 4b on the second dielectric layer 3b; and a vapor deposited colorant 2 at least partially encapsulating the core particle 1, such as a platelet. The core particle 1 can include exposed sides on the core particle 1, first and second dielectric layers 3a, 3b, and first and second absorber layers 4a, 4b. The core particle 1 can be a reflector material as described above with regard to FIG. 1.

Figure 7:
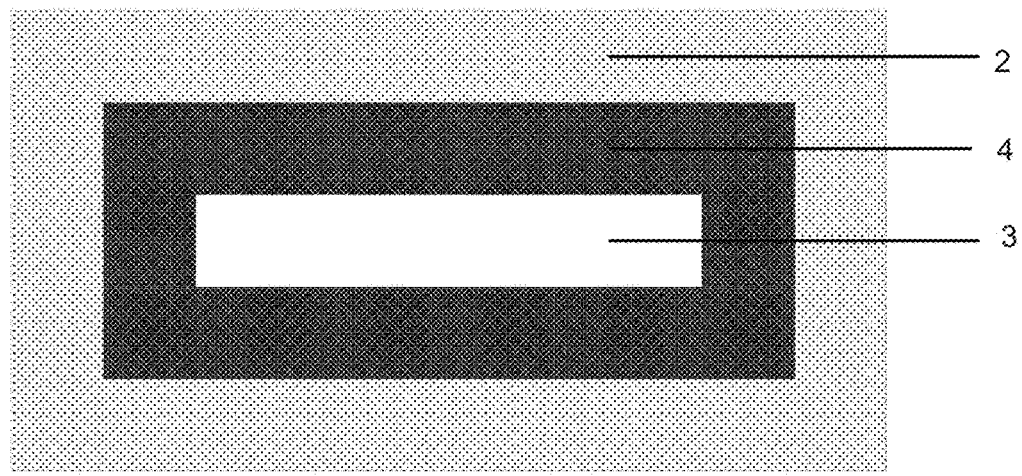
FIG. 7 is a particle according to another aspect of the invention.

FIG. 7 illustrates a particle, such as a thin film interference pigment, comprising a core particle 1 comprising a dielectric layer 3; and a vapor deposited colorant 2 at least partially encapsulating the dielectric layer 3. In an aspect, the particle can further comprise an absorber layer 4 at least partially encapsulating the dielectric layer 3, wherein the vapor deposited colorant 2 at least partially or totally encapsulates the absorber layer 4. The dielectric layer 3 and the absorber layer 4 can be made of the materials as described above.

Figure 8:
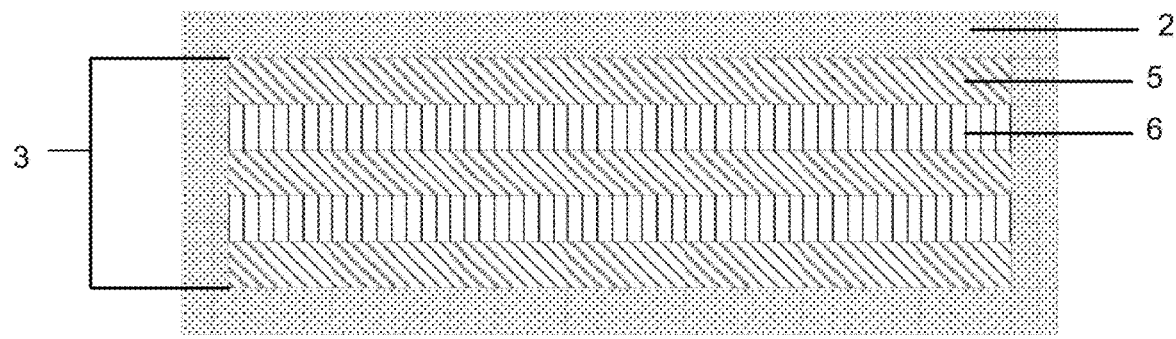
FIG. 8 is a particle according to another aspect of the invention.

FIG. 8 illustrates a particle, such as a thin film interference pigment, comprising a dielectric layer 3, such as an all dielectric multilayer; and a vapor deposited colorant 2 at least partially encapsulating the dielectric layer 3. In this aspect, the dielectric layer 3 can be a dielectric stack comprising at least one high refractive index layer 5 and at least one low refractive index layer 6. The dielectric stack can have a predetermined number of layers. In this example, the stack can include one or more layers of a low refractive index material 6 and one or more layers of a high refractive index material 5. The layers having low refractive index material (low refractive index layers) 6 and the layers having high refractive index material (high refractive index layers) 5 can alternate. In this particular example, as shown in FIG. 8, the alternating low and high refractive index layers have been repeated 3 times. The alternating layers can be stacked in any sequence, for example, the layers can be stacked in a sequence of $(H/L)_n$, $(H/L)_n H$, or $L(H/L)_n$ wherein H denotes higher refractive index layer 5 and L denotes a lower refractive index layer 6. The number of alternating low refractive index layers and the high refractive index layers (n) can range from about 2 to over about 75, such as from about 10 to about 50 alternating layers, or for example from about 5 to about 25 alternating layers.

In another aspect, there is disclosed a particle, such as a pigment, comprising a core particle 1, a dielectric layer 3 on opposite sides of the core particle 1; and a vapor deposited colorant 2 at least partially encapsulating the core particle 1 and dielectric layer 3. The dielectric layer 3 can, on each opposite side of the core particle 1, be a dielectric stack of high and low refractive index layers, as disclosed above.

Figure 9:
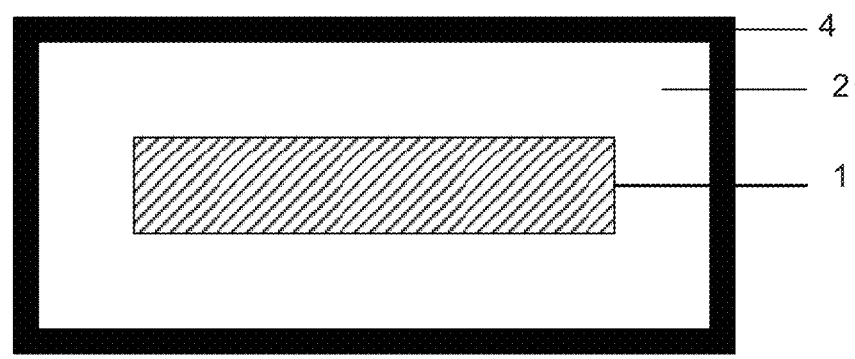
FIG. 9 is a particle according to another aspect of the invention.

FIG. 9 illustrates a particle, such as a thin film interference pigment, comprising a dielectric layer 3, such as an all dielectric multilayer; an absorber layer 4 at least partially encapsulating the dielectric layer 3; and a vapor deposited colorant 2 at least partially encapsulating the absorber layer 4. In this aspect, the dielectric layer 3 can be a dielectric stack comprising at least one high refractive index layer 5 and at least one low refractive index layer 6.

In another aspect, there is disclosed a pigment, such as a thin film interference pigment, comprising a core particle 1; and a vapor deposited colorant 2, wherein the vapor deposited colorant 2 is a composite layer comprising an organic uncolored material and an organic colored material. An example of an organic uncolored material is the family of Parylene:

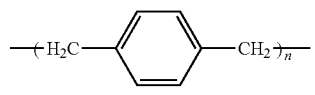

Parylene N

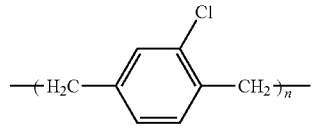

Parylene C

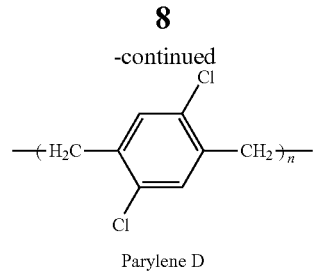

Parylene D

The Parylene is known for its low water permeability and UV protection. The physical and chemical properties of Parylene change depending on the type (N, C, or D). For example, a vapor deposited colorant 2 as a composite layer comprising Parylene C as an organic uncolored material can be more suitable in cases where an improved gas and moisture barrier properties are desired. It is envisioned that the composite layer comprising an organic uncolored material and an organic colored material can be used in place of the vapor deposited colorant 2 of FIGS. 5-9.

Figure 10:
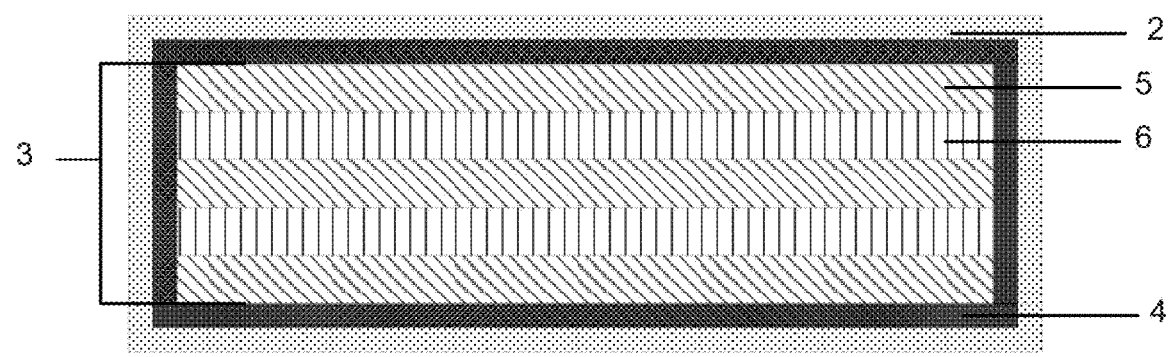
FIG. 10 is a particle according to another aspect of the invention.

FIG. 10 illustrates a particle comprising a core particle 1; a vapor deposited colorant 2 at least partially encapsulating the core particle 1; and an absorber layer 4 at least partially encapsulating the vapor deposited colorant 2. The vapor deposited colorant can be a composite layer comprising an organic colored material and an inorganic material, as described above. The core particle 1 can be a reflector material as described above with regard to FIG. 1.

Figure 11:
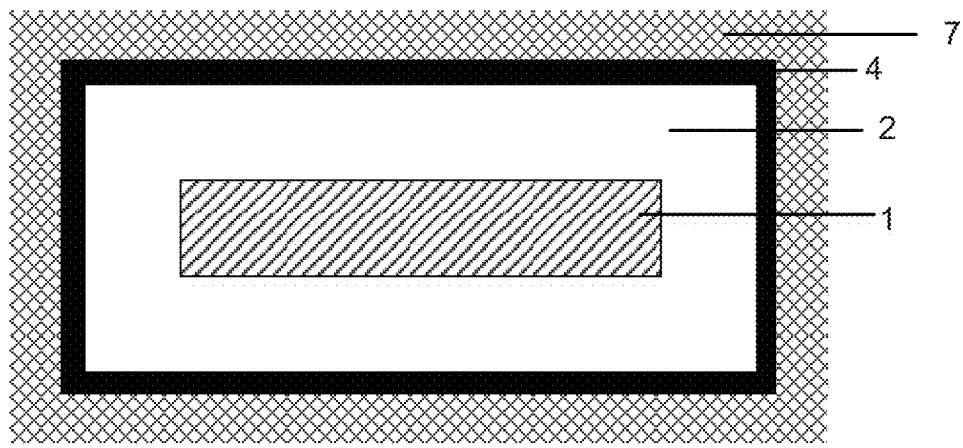
FIG. 11 is a particle according to another aspect of the invention.

FIG. 11 illustrates a particle, such as the pigment illustrated in FIG. 10, and further comprising a protecting layer 7. The protecting layer 7 can comprise an organic layer or an inorganic layer. The protecting layer 7 can protect the particle, can passivate the particle, and/or can functionalize the particle. Passivating the particle can inhibit partial oxidation, can decrease their reactivity to their surroundings, and/or can change the surface area of the external layers rendering the particle more or less hydrophobic or oleophobic. The core particle 1 can be a reflector material as described above with regard to FIG. 1.

Figure 12:
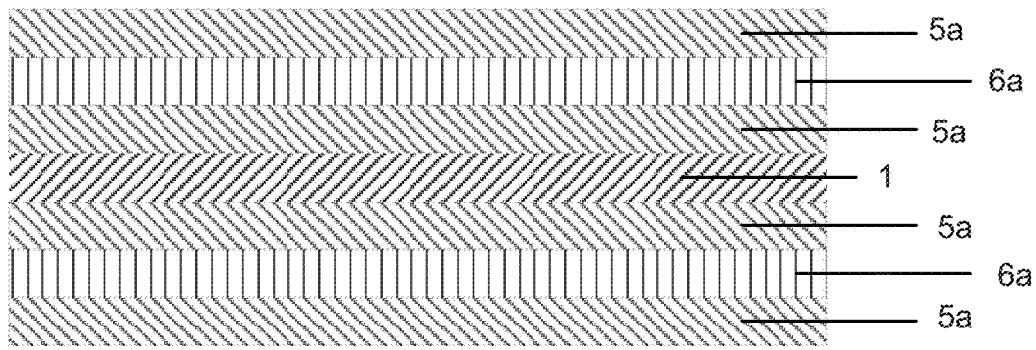
FIG. 12 is a particle according to another aspect of the invention.

FIG. 12 illustrates a particle comprising a core particle 1; and a dielectric layer 3, such as a multilayer dielectric layer, on opposites sides of the core particle 1; wherein the dielectric layer 3 is a stack of alternating layers of a composite with a high refractive index material and an organic colored material 5a and a composite with a low refractive index material and an organic colored material 6a. The core particle 1 can be a reflector material as described above with regard to FIG. 1. The dielectric layers can be selectively absorbing some wavelength of light by the addition of the organic colored material in the composite. For example, a composite layer 6a can be silica (low refractive index material) codeposited with an organic colored material to obtain a low refractive index material. As another example, a composite layer 5a can be titania (high refractive index material) codeposited with an organic colored material to obtain a high refractive index material.

Figure 13:
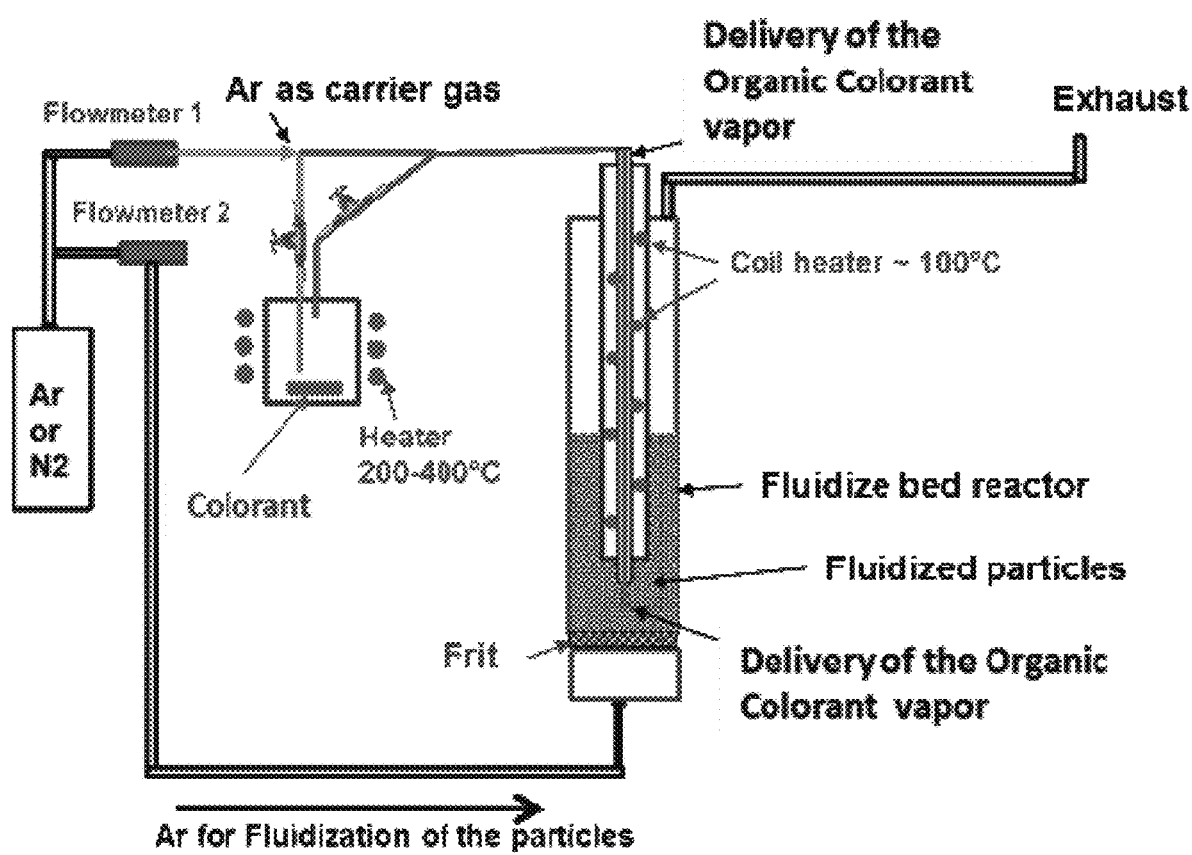
FIG. 13 is an equipment set-up for performing a method for making a particle according to an aspect of the invention.

The particles, such as pigments, disclosed herein can be obtained by using a fluidized bed reactor or equipment such as a rotating drum containing the tumbling the core particles. Particles, such as a core particle 1, can be introduced into a fluidized bed reactor or another suitable reactor where the particles are tumbling. An organic colored material can be introduced into the reactor using a carrier gas, such as argon. When the organic colored material comes into contact with the core particle 1 the organic vapor condensates at least partially, such as totally, encapsulating the core particle 1 with a vapor deposited colorant 2. FIG. 13 is an illustration of an equipment set-up for the method of making the particles, for example as illustrated in FIG. 1.

Figure 14:
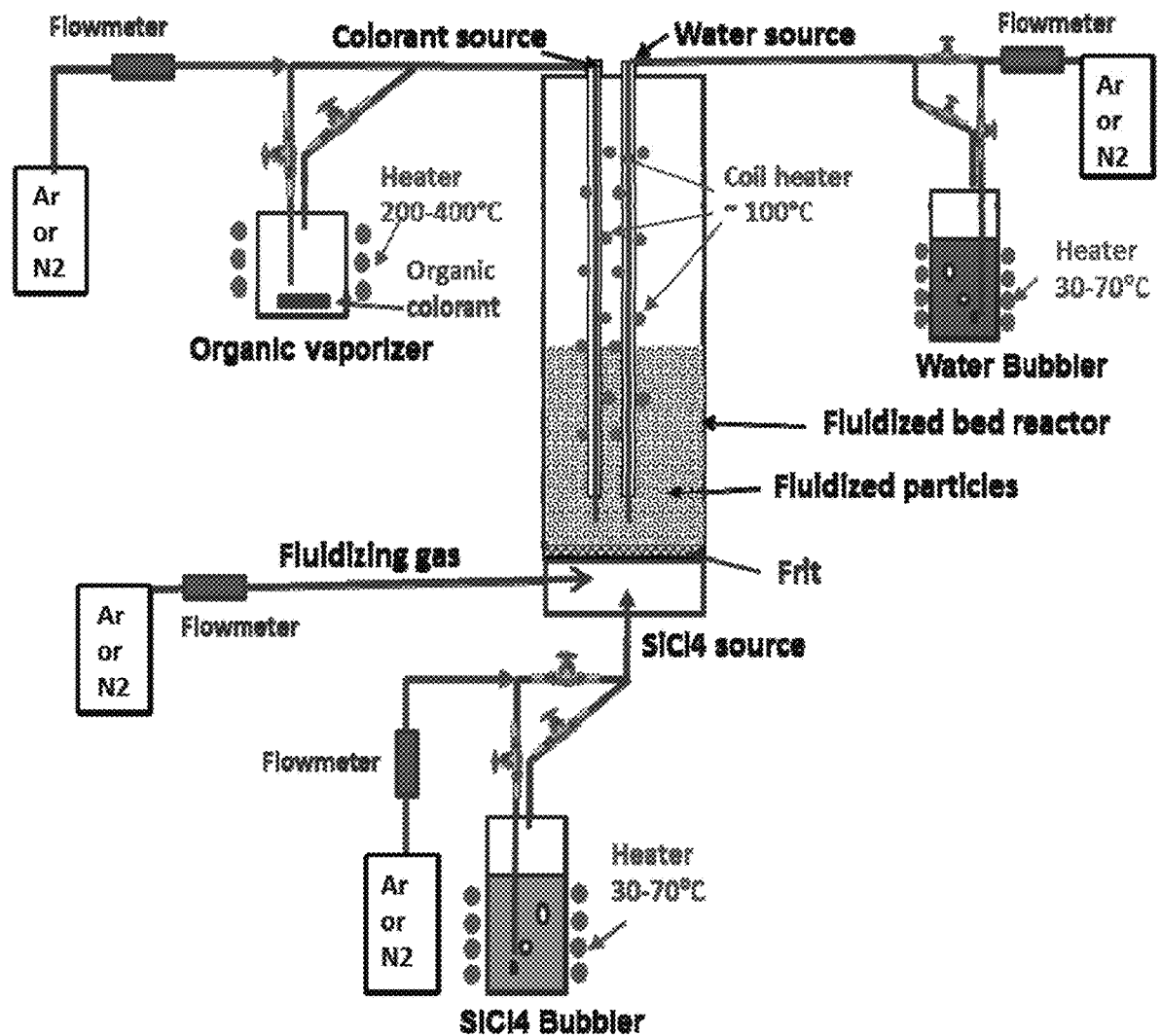
FIG. 14 is an equipment set-up for performing a method for making a particle according to another aspect of the invention.

In another aspect, the method of making particles comprising a core particle 1; and a vapor deposited colorant 2, wherein the vapor deposited colorant 2 is a composite comprising an organic colored material and an inorganic material, can be obtained using an equipment set-up as shown in FIG. 14. FIG. 14 is a representation of a combination atmospheric pressure organic vapor phase deposition (OVPD) and chemical vapor deposition (CVD) using a fluidized bed configuration.

The fluidized bed vapor deposition conditions can be similar to those for depositing a vapor deposited colorant 2 comprising an organic colored material, as shown in FIG. 13. In an example, a particle, such as a pigment, can be formed with silicon dioxide at almost room temperature (about 30° C. to about 80° C.), at atmospheric pressure using the hydrolysis of $SiCl_4$ and water as a precursor material. In another example, a particle, such as a pigment, can be formed with titanium dioxide at almost room temperature (about 30° C. to about 80° C.), at atmospheric pressure using the hydrolysis of $TiCl_4$ and water as a precursor material. Silicon dioxide is a low refractive index material and titanium dioxide is a high refractive index material. Either material can be used in the method to produce a vapor deposited colorant wherein the vapor deposited colorant is a composite layer.

The method of making a particle, such as a pigment, can comprise introducing a carrier gas into an organic colored material container; heating the organic colored material container to produce an organic colored vapor; introducing a carrier gas into a fluidized bed reactor or another suitable reactor where core particles 1 are tumbling. The core particle 1 can be in a shape of particles, platelets, or flakes; and introducing the organic colored vapor into the fluidized bed reactor to at least partially, such as totally, encapsulate the core particle 1.

The method of making the particles does not involve a wet environment, i.e., a wet substrate, etc. and therefore does not use any processes needed in wet chemistry processes, such as filtration, drying etc. The method can be performed at about atmospheric pressure and therefore does not require vacuum or equipment for vacuums. The vapor deposited colorant 2 can be deposited at room temperature allowing for codeposition of materials, such as composites of organic colored materials and inorganic materials, and composites of organic colored materials and organic uncolored materials.

The reaction conditions shown in the following Examples are based upon a bench top set-up. A scale-up to a full production process would therefore requirement an adjustment in the reaction conditions, e.g., flow rate of carrier gas; temperature of the organic colored material container, coil heater, line heater, water bubbler, and inorganic material bubbler. Additionally, the time to encapsulate would also vary based upon, for example, the desired resultant color, or the number of the core particles 1 to be encapsulated. However, the adjustment to the process conditions is well within the skill of one of ordinary skill in the art.

EXAMPLES

Example 1

Using the equipment set-up illustrated in FIG. 13, a pigment was formed with an aluminum core particle 1 and a Pigment Red 254 as the vapor deposited colorant 2.

The molecular structure of Pigment Red 254, a pyrrole, is as follows:

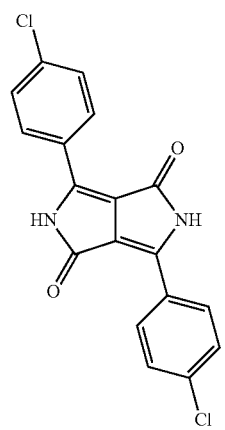 [SMILES: O=C1NC(c2ccc(Cl)cc2)=C2C(=O)NC(c3ccc(Cl)cc3)=C12]

The source of the organic colored material vapor was heated at 260° C. Argon was introduced in to the vapor source container as the carrier gas with a flow of 2100 sccm. To avoid condensation into the pipeline delivering the organic colored material vapor inside the fluidized bed reactor, the line was heated at 100° C. Argon was also used as the fluidization gas with a flow of 1200 sccm. The encapsulation temperature was slightly higher than atmospheric temperature, for example from about 30° C. to about 40° C. After 30 minutes, the encapsulated particles had become a light pink. After an additional 30 minutes of fluidized bed vapor deposition, the vapor deposited colorant 2 on the core particle 1 became stronger and finished with pigments having a strong red coloration.

Example 2

Using the equipment set-up illustrated in FIG. 13, a pigment was formed with an aluminum core particle 1 and a Pigment Violet 19 as the vapor deposited colorant 2.

The molecular structure of Pigment Violet 19, a quinacridone, is as follows:

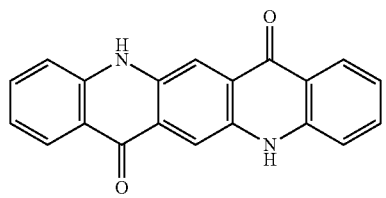 [SMILES: O=c1c2ccccc2[nH]c2cc3c(=O)c4ccccc4[nH]c3cc12]

The source of the organic colored material vapor was heated at 280° C. Argon was introduced in to the vapor source container as the carrier gas with a flow of 2100 sccm. To avoid condensation into the pipeline delivering the organic colored material vapor inside the fluidized bed reactor, the line was heated at 100° C. Argon was also used as the fluidization gas with a flow of 1200 sccm. The encapsulation temperature was slightly higher than atmospheric temperature, for example from about 30° C. to about 40° C. After 60 minutes, the vapor deposited colorant 2 on the core particle 1 became stronger and finished with pigments having a dark violet coloration.

Example 3

Using the equipment set-up illustrated in FIG. 13, a pigment was formed with an aluminum core particle 1 and a Pigment Blue 15 as the vapor deposited colorant 2.

The molecular structure of Pigment Blue 15, a phthalocyanine, is as follows:

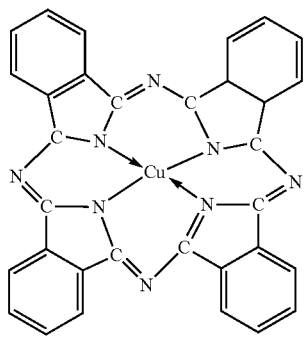

The source of the organic colored material vapor was heated at 250° C. Argon was introduced in to the vapor source container as the carrier gas with a flow of 2100 sccm. To avoid condensation into the pipeline delivering the organic colored material vapor inside the fluidized bed reactor, the line was heated at 100° C. Argon was also used as the fluidization gas with a flow of 1200 sccm. The encapsulation temperature was slightly higher than atmospheric temperature, for example from about 30° C. to about 40° C. After 60 minutes, the vapor deposited colorant 2 on the core particle 1 became stronger and finished with pigments having a dark blue coloration.

Example 4

Using the equipment set-up illustrated in FIG. 13, a pigment was formed with an aluminum core particle 1 and a Pigment Yellow 17 as the vapor deposited colorant 2.

The molecular structure of Pigment Yellow 17, a diazo, is as follows:

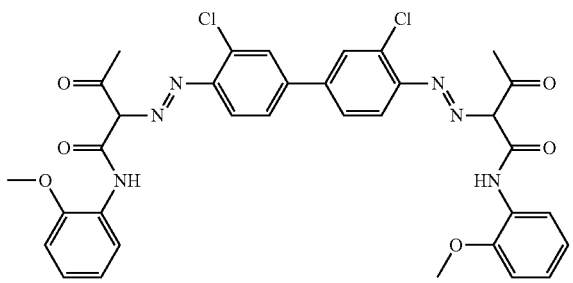 [SMILES: COc1ccccc1NC(=O)C(/N=N/c1ccc(-c2ccc(/N=N/C(C(C)=O)C(=O)Nc3ccccc3OC)c(Cl)c2)cc1Cl)C(C)=O]

The source of the organic colored material vapor was heated at 250° C. Argon was introduced in to the vapor source container as the carrier gas with a flow of 2100 sccm. To avoid condensation into the pipeline delivering the organic colored material vapor inside the fluidized bed reactor, the line was heated at 100° C. Argon was also used as the fluidization gas with a flow of 1200 sccm. The encapsulation temperature was slightly higher than atmospheric temperature, for example from about 30° C. to about 40° C. After 60 minutes, the vapor deposited colorant 2 on the core particle 1 became stronger and finished with pigments having a cream coloration. Some of the organic colored material decomposed during its evaporation and encapsulation.

From the foregoing description, those skilled in the art can appreciate that the present teachings can be implemented in a variety of forms. Therefore, while these teachings have been described in connection with particular embodiments and examples thereof, the true scope of the present teachings should not be so limited. Various changes and modifications may be made without departing from the scope of the teachings herein.

This scope disclosure is to be broadly construed. It is intended that this disclosure disclose equivalents, means, systems and methods to achieve the devices, activities and mechanical actions disclosed herein. For each device, article, method, mean, mechanical element or mechanism disclosed, it is intended that this disclosure also encompass in its disclosure and teaches equivalents, means, systems and methods for practicing the many aspects, mechanisms and devices disclosed herein. Additionally, this disclosure regards a coating and its many aspects, features and elements. Such a device can be dynamic in its use and operation, this disclosure is intended to encompass the equivalents, means, systems and methods of the use of the device and/or article of manufacture and its many aspects consistent with the description and spirit of the operations and functions disclosed herein. The claims of this application are likewise to be broadly construed.

The description of the inventions herein in their many embodiments is merely exemplary in nature and, thus, variations that do not depart from the gist of the invention are intended to be within the scope of the invention. Such variations are not to be regarded as a departure from the spirit and scope of the invention.

We claim:

1. A pigment, comprising:
   a core particle;
   an absorber layer on a portion of a surface of an external layer of a vapor deposited colorant, wherein the absorber layer includes a material chosen from a metal, combinations of metals, and alloys of metals; and
   the external layer of the vapor deposited colorant at least partially encapsulates the core particle and the absorber layer, wherein the vapor deposited colorant is a composite layer comprising an organic colored material and an inorganic material,
   wherein the inorganic material is a material having a refractive index ranging from about 1.3 to about 2.3.

2. The pigment of claim 1, wherein the core particle is a reflector material comprising at least one of a metal and metal alloy.

3. The pigment of claim 1, wherein the core particle is a metal comprising aluminum, zinc, steel, copper, silver, gold, platinum, palladium, nickel, cobalt, niobium, chromium, tin, and a mixture thereof.

4. The pigment of claim 1, wherein the core particle is a metal alloy comprising at least one of stainless steel, brass, and bronze.

5. The pigment of claim 1, wherein the vapor deposited colorant further comprises an organic uncolored material.

6. The pigment of claim 1, further comprising a dielectric layer.

7. The pigment of claim 1, further comprising a protection layer comprising at least one of a passivating layer and a functionalizing layer.

8. The pigment of claim 1, wherein the particle is a special effect pigment.

9. The pigment of claim 1, wherein the core particle comprises a dielectric layer.

10. The pigment of claim 9, wherein the dielectric layer is a dielectric stack of 3 layers of a high refractive index material interleaved with 2 layers of a low refractive index material.

11. The pigment of claim 1, wherein the particle is a thin film interference pigment.

12. A method of making particles, comprising depositing a composite layer of a colorant comprising an organic colored material and an inorganic material on an absorber layer via vapor deposition, wherein the inorganic material is a material having a refractive index ranging from about 1.3 to about 2.3.

13. The pigment of claim 1, further comprising a dielectric layer on a portion of the surface of the core particle, wherein the absorber layer is between the dielectric layer and the external layer of the vapor deposited colorant.

14. The pigment of claim 13, wherein the dielectric layer fully encapsulates the core particle, wherein the absorber layer fully encapsulates the dielectric layer, and wherein the external layer of the vapor deposited colorant fully encapsulates the absorber layer.

15. The pigment of claim 13, wherein the dielectric layer is a first dielectric layer and a second dielectric layer;
wherein the first dielectric layer and the second dielectric layer are on opposite surfaces of the core particle.

16. The pigment of claim 15, wherein the absorber layer is a first absorber layer and a second absorber layer;
wherein the first absorber layer is on a surface of the first dielectric layer and the second absorber layer is on a surface of the second dielectric layer.

17. The pigment of claim 9, wherein the absorber layer fully encapsulates the core particle, and wherein the external layer of the vapor deposited colorant fully encapsulates the absorber layer.

18. The pigment of claim 10, wherein the absorber layer fully encapsulates the dielectric stack; and the external layer of the vapor deposited colorant fully encapsulates the absorber layer.

19. The pigment of claim 1, wherein the organic colored material is an organic pigment.

20. The pigment of claim 1, wherein the organic colored material is an organic dye.

* * * * *